US006998682B2

(12) United States Patent
Chan et al.

(10) Patent No.: US 6,998,682 B2
(45) Date of Patent: Feb. 14, 2006

(54) METHOD OF FORMING A PARTIALLY DEPLETED SILICON ON INSULATOR (PDSOI) TRANSISTOR WITH A PAD LOCK BODY EXTENSION

(75) Inventors: Yeen Tat Chan, Singapore (SG); Kheng Chok Tee, Singapore (SG); Yiang Aun Nga, Singapore (SG); Zhao Lun, Singapore (SG); Wang Ling Goh, Singapore (SG); Diing Shenp Ang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/128,010

(22) Filed: May 12, 2005

(65) Prior Publication Data

US 2005/0208712 A1    Sep. 22, 2005

Related U.S. Application Data

(62) Division of application No. 10/628,913, filed on Jul. 29, 2003, now Pat. No. 6,905,919.

(51) Int. Cl.
   *H01L 27/01*    (2006.01)
(52) U.S. Cl. .................. 257/347; 257/348; 257/349
(58) Field of Classification Search ............... 257/347, 257/348
   See application file for complete search history.

(56) References Cited

U.S. PATENT DOCUMENTS

| 5,145,802 | A | 9/1992 | Tyson et al. ................ 437/63 |
| 5,405,795 | A | 4/1995 | Beyer et al. ................ 437/41 |
| 5,886,385 | A | 3/1999 | Arisumi et al. ............. 257/347 |
| 5,973,364 | A * | 10/1999 | Kawanaka .................. 257/347 |
| 6,337,230 | B1 | 1/2002 | Hirano ....................... 438/149 |
| 6,521,959 | B1 | 2/2003 | Kim et al. .................. 257/397 |
| 6,537,861 | B1 | 3/2003 | Kroell et al. ............... 438/149 |
| 2002/0048972 | A1 * | 4/2002 | Yamaguchi et al. ......... 438/926 |
| 2002/0109187 | A1 * | 8/2002 | Matsumoto et al. ........ 257/347 |

OTHER PUBLICATIONS

W.K. Yeh et al., "High Performance 0.1 μm Partially Depleted SOI CMOSFET," 2000 IEEE Int'l SOI Conf. Oct. 2000, pp. 68-69.

J.P. Colinge, *Silicon On Insulator Technology: Material to VLSI*, 2nd Ed., Kluwer Academic Publishers, (1997), SOI MOSFET Design, pp. 117-120.

* cited by examiner

Primary Examiner—Trung Dang
(74) Attorney, Agent, or Firm—George O. Saile; Rosemary L.S. Pike

(57) ABSTRACT

A MOSFET device structure formed on a silicon on insulator layer, and a process sequence employed to fabricate said MOSFET device structure, has been developed. The process features insulator filled, shallow trench isolation (STI) regions formed in specific locations of the MOSFET device structure for purposes of reducing the risk of parasitic transistor formation underlying a gate structure junction. After formation of either a "T" shaped, or an "H" shaped gate structure, body contact regions of a first conductivity type are formed adjacent to both an STI region and to a component of the gate structure. Formation of a source/drain region of a second conductivity type located on the opposite side of the same STI region, and the same gate structure component, is next performed. Unwanted parasitic transistor formation, which can occur underlying the gate structure via the body contact region and the source/drain region, is prevented by the presence of the separating STI region.

22 Claims, 5 Drawing Sheets

METHOD OF FORMING A PARTIALLY DEPLETED SILICON ON INSULATOR (PDSOI) TRANSISTOR WITH A PAD LOCK BODY EXTENSION

This is a division of patent application Ser. No. 10/628,913, now U.S. Pat. No. 6,905,919 filing date Jul. 29, 2003, "METHOD OF FORMING A PARTIALLY DEPLETED SILICON ON INSULATOR (PDSOI) TRANSISTOR WITH A PAD LOCK BODY EXTENSION", assigned to the same assignee as the present invention, which is herein incorporated by reference in its entirety.

BACKGROUND OF THE INVENTION (1) Field of the Invention

The present invention relates to methods used to fabricate semiconductor devices, and more specifically to a method used suppress the effect of floating body regions used with metal oxide semiconductor field effect transistor (MOSFET) devices formed on an SOI layer.

(2) Description of Prior or Art

The ability to form MOSFET devices, such as a partially depleted MOSFET device, on a silicon on insulator (SOI) layer has resulted in decreased junction capacitance and thus increased device performance. To avoid a body floating phenomena which can result in deleterious device characteristics such as a low source to drain breakdown voltage, as well as threshold voltage reduction, direct contact between the semiconductor substrate and a body contact region, formed in the SOI layer, is employed. However designs using a body contact region of a first conductivity type can form unwanted parasitic transistor with source and drain regions of a second conductivity type, in an area adjacent to, or underlying the gate structure of the MOSFET device. The leakage current resulting from the unwanted parasitic transistors can negatively influence the performance of the MOSFET device.

The present invention will describe a structure, as well as a process used to fabricate this structure, that reduces the leakage current driven by the parasitic transistors that can form at a gate electrode junction. The same structure in addition to reducing leakage current of unwanted parasitic transistors, also allows greater control of gate width to be realized. Prior art such as Kroell et al in U.S. Pat. No. 6,537,861 B1, Beyer et al in U.S. Pat. No. 5,405,795, Kim et al in U.S. Pat. No. 6,521,959 B2, and Tyson et al in U.S. Pat. No. 5,145,802, describe methods of forming body extension and body contact regions, however these prior art do not describe the structure and process used in this present invention which features the reduction of the deleterious leakage current generated by the presence of the body contact region via inclusion of novel isolation regions.

SUMMARY OF THE INVENTION

It is an object of this invention to fabricate a MOSFET device in a SOI layer employing body contact regions formed in the same SOI layer.

It is another object of this invention to form shallow trench isolation (STI) regions in the SOI layer, with the STI regions located underlying a portion of a gate structure in turn located between the body contact region and adjacent MOSFET source/drain regions, to eliminate parasitic transistor formation at the junction of the gate structure and body contact region.

It is still another object of this invention to employ STI regions between body contact regions and specific elements of a MOSFET device, wherein the STI regions are underlying portions of "T" shaped, as well portions of "H" shaped conductive gate structures.

In accordance with the present invention a MOSFET device structure, and a process used to fabricate said MOSFET device structure, featuring STI regions placed at specific locations of the MOSFET device, and used to eliminate parasitic transistor formation at the junction of the MOSFET regions, is described. Before growth of a gate insulator layer on a silicon on insulator (SOI) layer, insulator filled STI regions are formed in the SOI layer, with the depth of the STI region equal to the thickness of the SOI layer. "T" shape or "H" shape conductive gate structures are next defined on the underlying gate insulator layer and on portions of the STI regions. A body contact region featuring the same conductivity type as the semiconductor substrate is next formed in an non-active region of the SOI layer, adjacent to a component of the conductive gate structure and butting the STI region. Source/drain regions are then formed in portions of the active device regions of the SOI layer not covered by the conductive gate structure, with the source/drain regions located adjacent to the same conductive gate structure component, and butting the opposite side of the same STI region.

BRIEF DESCRIPTION OF THE DRAWINGS

The object and other advantages of this invention are best described in the preferred embodiment with reference to the attached drawings that include:

FIGS. 1A–5A, which schematically show top views of the MOSFET device structure, comprised with STI regions located at the junction of the gate structure and body contact region, at various stages of fabrication.

DESCRIPTION OF THE PREFERRED EMBODIMENTS

Figure 1A:
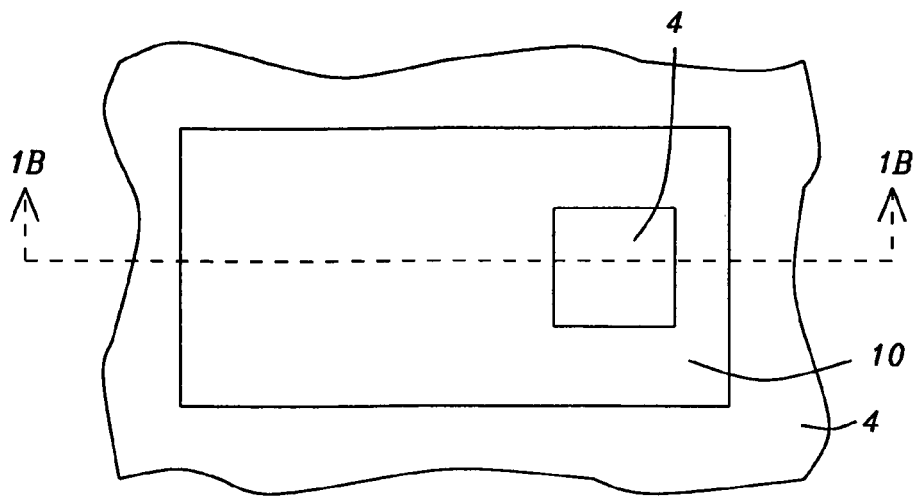
Figure 1B:
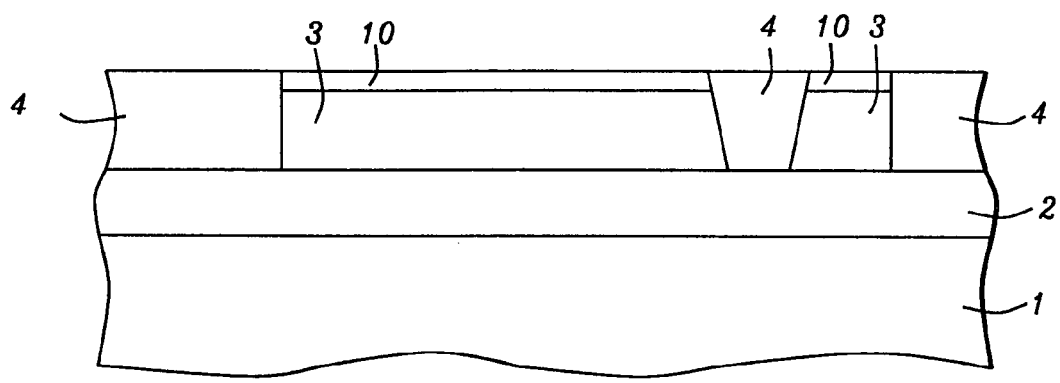
FIGS. 1B, 2B, 2C, 3B, 4B and 5B, which schematically in cross-sectional style describe key stages used to fabricate a MOSFET device featuring STI regions formed to eliminate parasitic transistor formation at the junction of the MOSFET gate structure and a body contact region.

The method of fabricating a MOSFET structure featuring STI regions formed at specific locations of the MOSFET device, to reduce parasitic transistor formation at the junction of a MOSFET device region and a body contact region underlying a conductive gate structure, will now be described in detail. Semiconductor substrate 1, comprised of P type, single crystalline silicon featuring a <100> crystallographic orientation, is used and schematically shown in FIG. 1B. A silicon on insulator (SOI) layer comprised of silicon layer 3, on silicon oxide layer 2, is next formed on semiconductor substrate 1, via a SIMOX (separation by implanted oxygen), procedure. The SIMOX procedure features implantation of oxygen ions into semiconductor substrate 1, followed by an anneal procedure resulting in a buried silicon oxide layer 2, at a thickness between about 1000 to 3000 Angstroms, and overlying, the non-implanted top portion of semiconductor substrate 1, now defined as silicon layer 3, at a thickness between about 1000 to 3000 Angstroms. If desired the SOI configuration can also be obtained via bonding of a first silicon oxide layer located on a first semiconductor substrate, to an second silicon oxide layer located on a second semiconductor substrate. Removal of semiconductor material from semiconductor substrate, to a point in which the thinned semiconductor substrate is now the silicon layer of the SOI configuration, is then accomplished via a chemical mechanical polishing (CMP) procedure. Photolithographic and dry etching procedures are next used to selectively define the desired configuration of silicon shape 3, overlying insulator layer 2. Removal of the photoresist shape used for definition of silicon layer, or silicon shape 3, is accomplished via plasma oxygen ashing procedures.

To reduce the risk of parasitic transistor formation at specific regions of the MOSFET device insulator filled, shallow trench isolation (STI), regions 4, are formed at the specific locations in which subsequent parasitic transistor formation can result. Photolithographic and reactive ion etching (RIE), procedures are used to define shallow trench shapes in silicon layer 3, using $Cl_2$ as a selective etchant for silicon. The selective RIE procedure terminates at the appearance of insulator layer 2. The area of the shallow trench shapes is maintained small, defined with an area between about 2Lg×2Lg to 10Lg×10Lg um², (wherein Lg is equal to gate length), to minimize hot carrier generation. An insulator layer such as silicon oxide is next deposited via low pressure chemical vapor deposition (LPCVD), or via plasma enhanced chemical vapor deposition (PECVD), procedures, completely filling the shallow trench shapes. Removal of portions of the shallow trench filling insulator layer from the top surface of silicon layer 3, is accomplished selectively via a CMP procedure, resulting in STI regions 4, in silicon layer 3. This is shown schematically in cross-sectional style in FIG. 1B, with the top view of the in-process MOSFET device shown schematically as a top view in FIG. 1A. After formation of STI regions 4, gate insulator layer 10, comprised of silicon dioxide is thermally grown to a thickness between about 10 to 100 Angstroms. This is shown schematically in FIG. 1B.

Figure 2A:
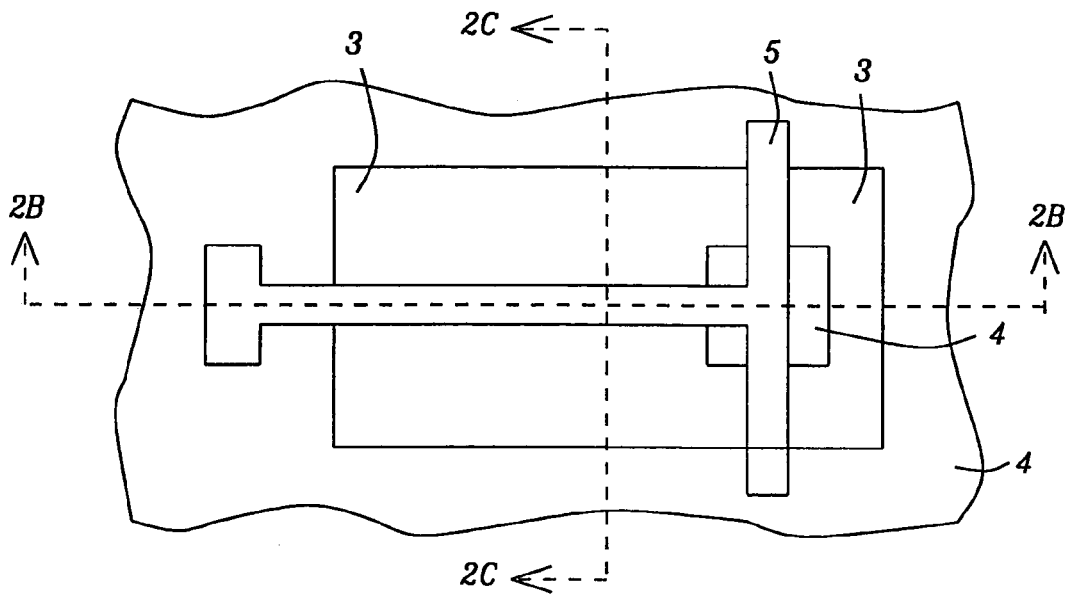
Figure 2B:
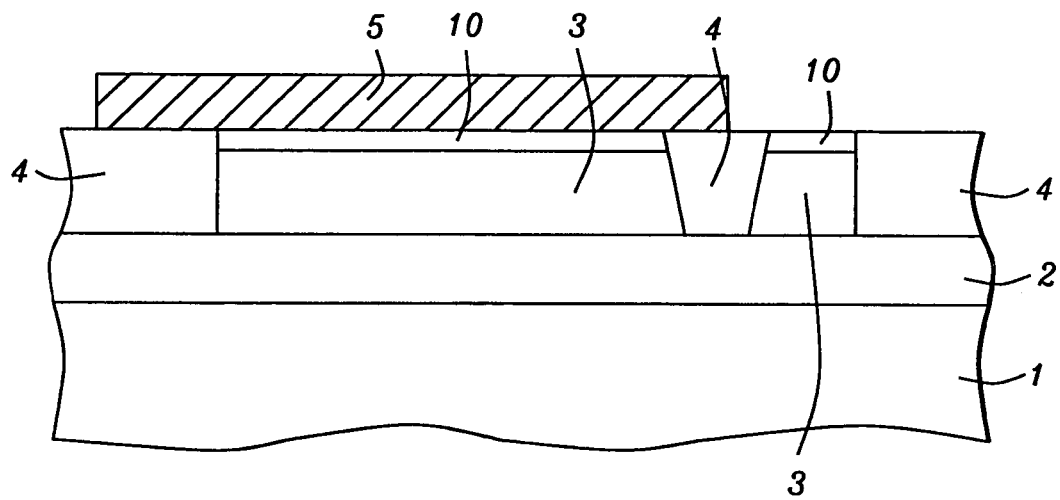
Figure 2C:
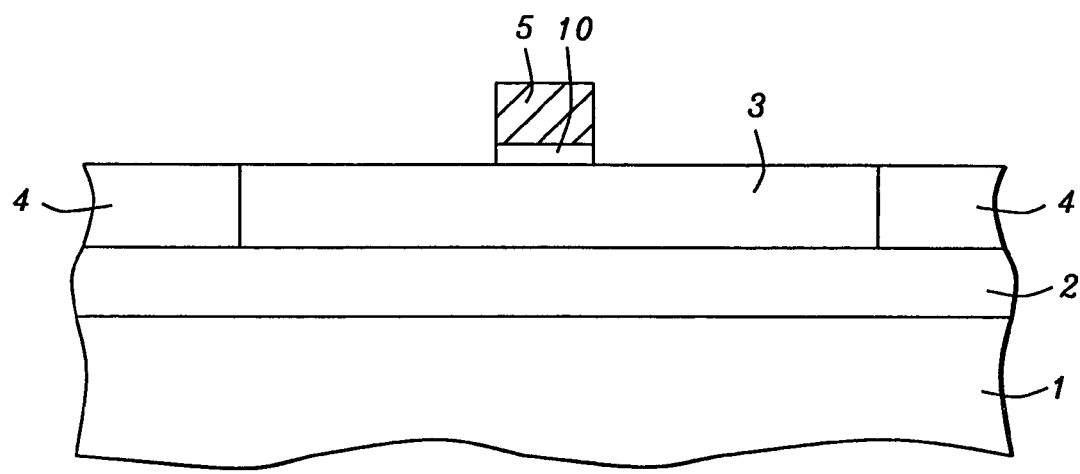

Formation of a conductive gate structure is next addressed and shown schematically in cross-sectional style using FIGS. 2B and 2C, and shown as a top view using FIG. 2A. A conductive material such as polysilicon is deposited via LPCVD procedures at a thickness between about 1000 to 2000 Angstroms. The polysilicon layer can be doped in situ during deposition via the addition of arsine or phosphine to a silane or disilane ambient, or the polysilicon layer can be deposited intrinsically then doped via implantation of arsenic or phosphorous ions. Photolithographic and anisotropic RIE procedures, using $Cl_2$ as a selective etchant for polysilicon, are used to define polysilicon gate structure 5. If desired gate structure 5, can be comprised of a metal silicide layer such as tungsten silicide, or comprised of a composite featuring an overlying metal silicide component on an underlying polysilicon component. FIG. 2A, schematically shows a "T" shaped polysilicon gate structure with the width of the horizontal component of polysilicon gate structure 5, located in an active device region, between about 10 to 350 nm. This width will subsequently define the channel length of the MOSFET device. The vertical component of polysilicon gate structure 5, is defined overlying a portion of the top surface of STI region 4. Without the presence of STI region 4, subsequent formation of a body contact region in a non-device region of the MOSFET device in an area adjacent to a source/drain region could result in the creation of a parasitic transistor underlying the polysilicon gate structure 5, at the edge of the active device region. This unwanted result is avoided via formation of STI region 4, at the specific location in which the parasitic transistor would be formed. In addition the presence of STI region 4, partially determines gate width, thus reducing the margin of photolithographic alignment error, resulting in improved greater gate width to be realized. The result of these procedures, shown schematically as a top view in FIG. 2A, is also shown in cross-sectional style in FIG. 2B. The active device region at this stage of fabrication is schematically shown in cross-sectional style in FIG. 2C.

Figure 3A:
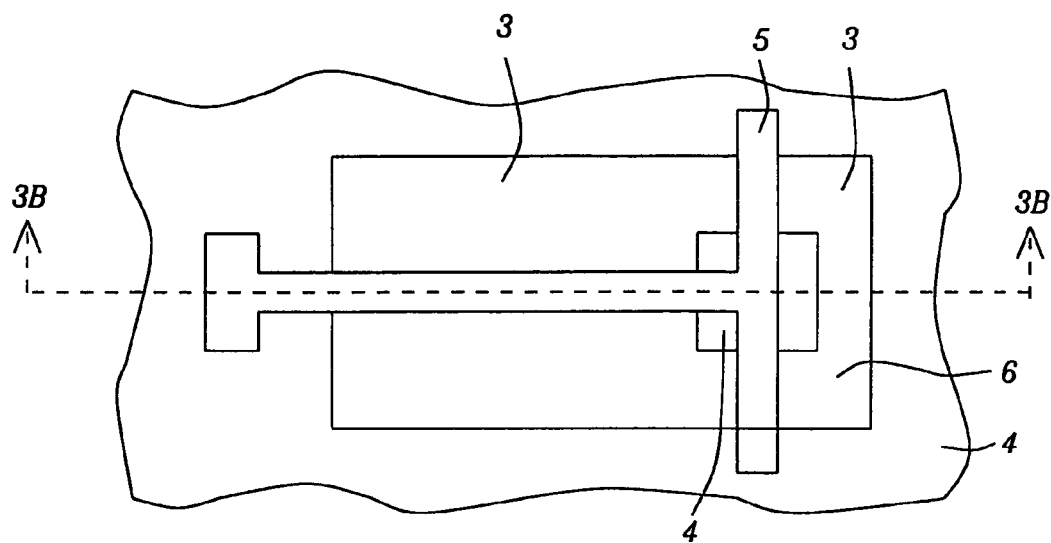
Figure 3B:
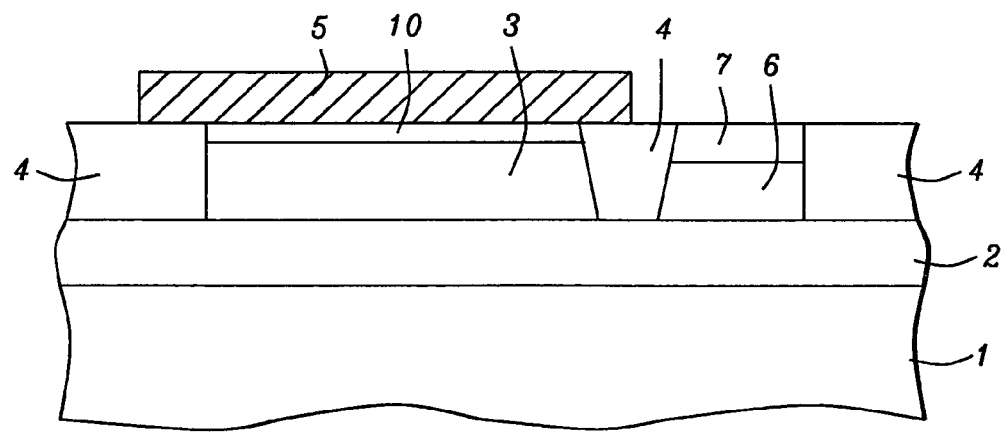

A portion of silicon shape 3, located between shallow trench regions 4, will be used for will be used as body contact region 6, while remaining portions of silicon shape 3, not covered by polysilicon gate structure 5, will subsequently be used to accommodate MOSFET source/drain regions. This is schematically shown in cross-sectional style in FIG. 3B, and as a top view using FIG. 3A.

Figure 4A:
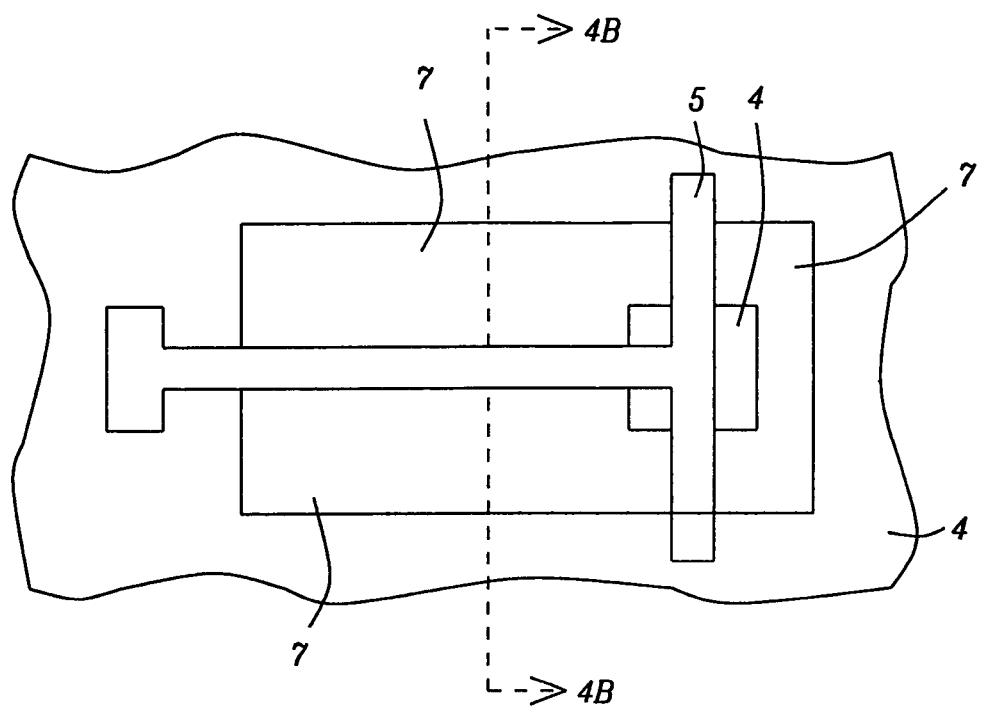
Figure 4B:
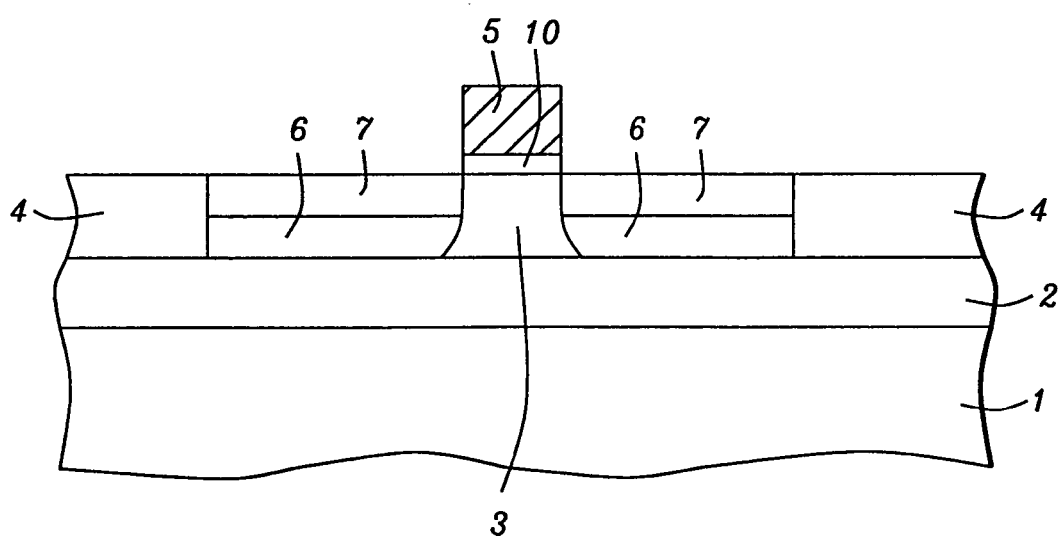

This invention can be used for both N channel (NMOS), devices, as well as for P channel (PMOS), devices. Description of an NMOS device featuring a body contact region and shallow trench isolation will be described below, however it should be understood that PMOS devices, or complimentary metal oxide semiconductor (CMOS), devices comprised of both NMOS and PMOS devices, can be fabricated using this invention. After removal of the photoresist shape used to define polysilicon gate structure 5, via plasma oxygen ashing and wet clean procedures, formation of either N type or P type regions in the device area of the MOSFET structure is addressed. A photoresist block out shape, not shown in the drawings, is used to protect a portion of a PMOS region (not shown in the drawings), from an N type ion implantation procedure used to form the heavily doped N type source/drain region of the NMOS device. Implantation of arsenic or phosphorous ions is performed at an energy between about 5 to 40 KeV, at a dose between about 2E15 to 8E15 atoms/cm². The same N type ion implantation procedure is also applied to the portion of a PMOS device creating an N type body contact region for the PMOS device. After removal of the photoresist blockout shape via plasma oxygen ashing procedures, an anneal procedure is performed to activate the implanted N type ions, resulting in N type source/drain regions 7, in portions of silicon shape 3, not covered by polysilicon gate structure 5. In addition a heavily doped N type region is also formed in a top portion of body contact region 6. This is schematically shown in cross-sectional style in FIG. 4B, and shown as a top view in FIG. 4A. The identical process sequence is also employed for the formation of heavily doped P type source/drain regions for the PMOS device. That is photoresist block out of the NMOS region allowing a P type ion implantation procedure to form a heavily doped P type heavily doped source/drain region only in the PMOS device region. An N type body contact region had already been formed in the PMOS region during the ion implantation procedure used to form the N type heavily doped source drain region for the NMOS device. This is not shown in the drawings.

The completion of the MOSFET device featuring STI regions 4, used to reduce the possible formation of a parasitic transistor at a junction underlying polysilicon gate structure is accomplished via formation of insulator spacers on the sides of polysilicon gate structure 5, as well as metal silicide formation on source/drain regions 7, body contact region 6, and on the top surface of polysilicon gate structure 5. These processes are not described in this application.

The inclusion of STI regions to reduce the risk of parasitic transistor formation at specific regions of the MOSFET devices formed on SOI layers, shown for "T" shaped gate structures in the preceding description can also be applied to MOSFET devices formed on SOI layers, comprised with different gate structures, such as "H" shaped gate structures.

Figure 5A:
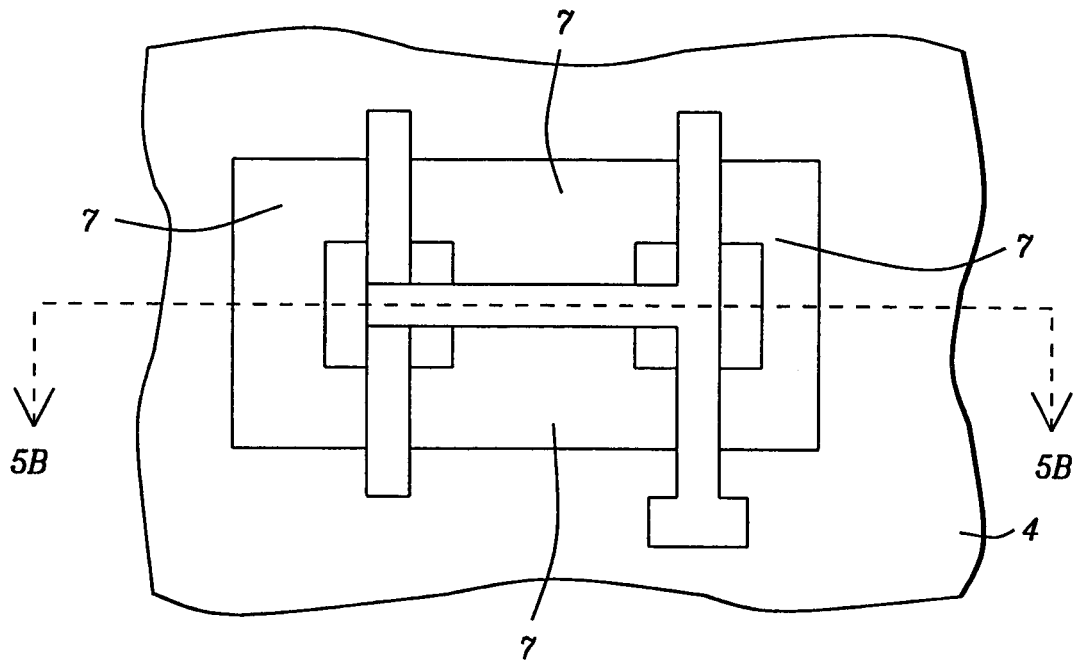
Figure 5B:
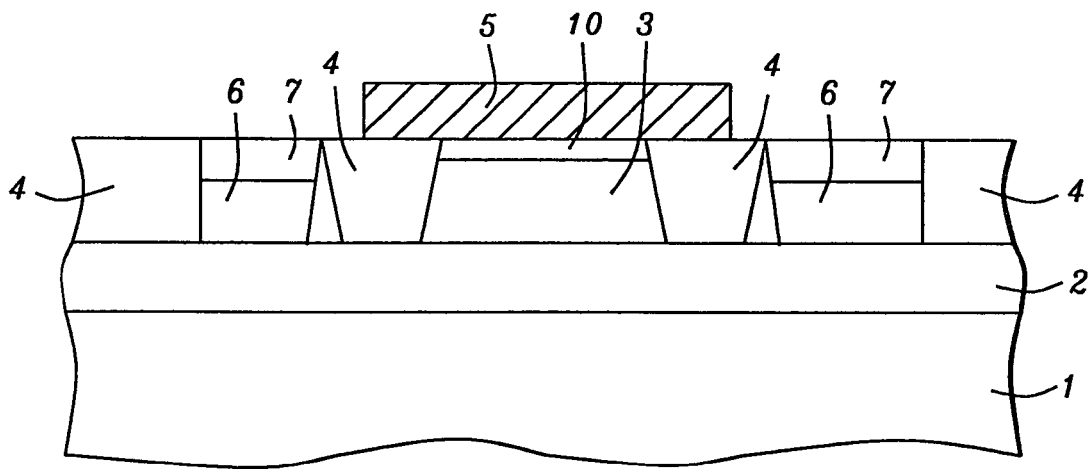

The identical process sequence used to reduce parasitic transistor formation for the MOSFET device featuring a "T" shaped gate structure is again employed to fabricate a MOSFET device comprised with an "H" shaped gate structure. STI regions 4, are again formed in specific regions of the MOSFET device resulting in an active device region, or the channel width defined by the space between STI regions 6, while channel length is still defined by the width of the conductive gate structure 5. Parasitic transistor formation is reduced underlying the junction of the conductive gate structure components via the physical separation of body contact region 6, and source/drain regions 7, supplied by STI regions 4. This is schematically shown as a top view in FIG. 5A, and as a cross-sectional view in FIG. 5B.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, comprising:
   an insulator layer on a semiconductor substrate;
   a silicon shape on said insulator layer;
   an insulator filled, shallow trench isolation (STI) region in said silicon shape, with said STI region terminating at the top surface of said insulator layer;
   a gate insulator layer on portions of the top surface of said silicon shape not occupied by said STI region;
   a "T" shaped conductive gate structure comprised with a horizontal component on said gate insulator layer located on a first portion of said silicon shape and comprised with a vertical component attached to said horizontal component of said conductive gate structure, with the junction of said vertical portion of said conductive gate structure and said horizontal portion of said conductive gate structure overlying a portion of said STI region, and with said vertical portion of said conductive gate structure and said STI region separating said first portion of said silicon shape from a second portion of said silicon shape;
   a body contact region in said second portion of said silicon shape; and
   a source/drain region in an area of said first portion of said silicon shape not covered by said horizontal component of said conductive gate structure.

2. The MOSFET device structure of claim 1, wherein said semiconductor substrate is a P type semiconductor substrate.

3. The MOSFET device structure of claim 1, wherein said insulator layer is a silicon oxide layer, at a thickness between about 1000 to 3000 Angstroms.

4. The MOSFET device structure of claim 1, wherein the thickness of said silicon shape is between about 1000 to 3000 Angstroms.

5. The MOSFET device structure of claim 1, wherein said STI region is filled with silicon oxide.

6. The MOSFET device structure of claim 1, wherein the depth of said STI region is between about 1000 to 3000 Angstroms.

7. The MOSFET device structure of claim 1, wherein the area of said STI region is between about 2Lg×2Lg to 10Lg×10Lg um$^2$, wherein Lg is the gate length.

8. The MOSFET device structure of claim 1, wherein the width of said conductive gate structure is between about 10 to 350 um.

9. The MOSFET device structure of claim 1, wherein said conductive gate structure is comprised of polysilicon at a thickness between about 1000 to 2000 Angstroms.

10. The MOSFET device structure of claim 1, wherein said body contact region is a P type or N type body contact region.

11. The MOSFET device structure of claim 1, wherein said source/drain region is an N type or P type source/drain region.

12. A MOSFET device structure, comprising:
    an insulator layer on a semiconductor substrate;
    a silicon shape on said insulator layer;
    insulator filled, shallow trench isolation (STI) regions in said silicon shape, with each STI region terminating at the top surface of said insulator layer, and with space between said STI regions defining a first portion of said silicon shape;
    a gate insulator layer on portions of the top surface of said silicon shape not occupied by said STI regions;
    an "H" shaped conductive gate structure comprised with a horizontal component on said gate insulator layer located on said first portion of said silicon shape, and comprised with verticals component each attached to each end of said horizontal component of said conductive gate structure, with the junctions of the vertical portions of said conductive gate and the horizontal portion of said conductive gate structure overlying a portion of an STI region, and with combination of each vertical portion of said conductive gate structure and STI region separating said first portion of said silicon shape from second portions of said silicon shape;
    a body contact region in said second portions of said silicon shape; and
    a source/drain region in an area of said first portion of said silicon shape not covered by said horizontal component of said conductive gate structure.

13. The MOSFET device structure of claim 12, wherein said semiconductor substrate is a P type semiconductor substrate.

14. The MOSFET device structure of claim 12, wherein said insulator layer is a silicon oxide layer, at a thickness between about 1000 to 3000 Angstroms.

15. The MOSFET device structure of claim 12, wherein the thickness of said silicon shape is between about 1000 to 3000 Angstroms.

16. The MOSFET device structure of claim 12, wherein said STI regions are filled with silicon oxide.

17. The MOSFET device structure of claim 12, wherein the depth of said STI regions is between about 1000 to 3000 Angstroms.

18. The MOSFET device structure of claim 12, wherein the area of said STI regions is between about 2Lg×2Lg to 10Lg×10Lg um$^2$, wherein Lg is the gate length.

19. The MOSFET device structure of claim 12, wherein the width of said conductive gate structure is between about 10 to 350 um.

20. The MOSFET device structure of claim 12, wherein said conductive gate structure is comprised of polysilicon, at a thickness between about 1000 to 2000 Angstroms.

21. The MOSFET device structure of claim 12, wherein said body contact region is a P type or N type body contact region.

22. The MOSFET device structure of claim 12, wherein said source/drain region is an N type or a P type source/drain region.

* * * * *